United States Patent
Wang et al.

(10) Patent No.: US 10,974,442 B2
(45) Date of Patent: Apr. 13, 2021

(54) SET-UP AND METHOD OF ELECTROHYDRODYNAMIC JET 3D PRINTING BASED ON RESULTANT EFFECT OF ELECTRIC FIELD AND THERMAL FIELD

(71) Applicant: Dalian University of Technology, Dalian (CN)

(72) Inventors: Dazhi Wang, Dalian (CN); Kai Li, Dalian (CN); Tongqun Ren, Dalian (CN); Junsheng Liang, Dalian (CN)

(73) Assignee: Dalian University of Technology, Liaoning (CN)

( * ) Notice: Subject to any disclaimer, the term of this patent is extended or adjusted under 35 U.S.C. 154(b) by 401 days.

(21) Appl. No.: 16/303,556

(22) PCT Filed: Feb. 5, 2018

(86) PCT No.: PCT/CN2018/075329
§ 371 (c)(1),
(2) Date: Nov. 20, 2018

(87) PCT Pub. No.: WO2018/177029
PCT Pub. Date: Oct. 4, 2018

(65) Prior Publication Data
US 2019/0308366 A1    Oct. 10, 2019

(30) Foreign Application Priority Data
Mar. 30, 2017    (CN) .......................... 201710198238.3

(51) Int. Cl.
*B29C 64/112*    (2017.01)
*B33Y 10/00*    (2015.01)
(Continued)

(52) U.S. Cl.
CPC .......... *B29C 64/112* (2017.08); *B29C 64/209* (2017.08); *B29C 64/227* (2017.08);
(Continued)

(58) Field of Classification Search
None
See application file for complete search history.

(56) References Cited

FOREIGN PATENT DOCUMENTS

| CN | 103341989 A | 10/2013 |
|----|-------------|---------|
| CN | 105058786 A | 11/2015 |

(Continued)

OTHER PUBLICATIONS

Wang et al., Electrohydrodynamic jet printing and a preliminary electrochemistry test of graphene micro-scale electrodes (Mar. 7, 2016), J. Micromech. Microeng., vol. 26. (Year: 2016).*

(Continued)

*Primary Examiner* — Matthew J Daniels
*Assistant Examiner* — Paul Spiel
(74) *Attorney, Agent, or Firm* — Muncy, Geissler, Olds & Lowe, P.C.

(57) ABSTRACT

The present invention belongs to the field of advanced manufacturing technology and relates to one set-up and method of electrohydrodynamic jet 3D printing based on resultant effect of electric field and thermal field. This method is used to fabricate micro/nano 3D structure, under the resultant effects of electro hydrodynamic force and thermal field. First of all, the ink reaches needle orifice at a constant speed under the resultant effect of fluid field and gravity field. Then a high voltage electric field is applied between needle and substrate. And the ink is dragged to form stable micro/nano scale jet which is far smaller than the needle size using the electric field shear force generated at needle orifice. The solvent evaporation rate of ink increases combined with the radiation of thermal field at the same (Continued)

time. Finally, the micro/nano scale 3D structure is fabricated on substrate with the accumulation of jet layer by layer. Compared with liquid jet printing technology, this method describing in present invention owns many advantages, including wide adaptability of material and manufacturing complex micro/nano scale 3D structures.

2 Claims, 3 Drawing Sheets

(51) Int. Cl.
*B33Y 30/00* (2015.01)
*B33Y 50/02* (2015.01)
*B29C 64/295* (2017.01)
*B29C 64/209* (2017.01)
*B29C 64/393* (2017.01)
*B29C 64/227* (2017.01)
*B81C 1/00* (2006.01)

(52) U.S. Cl.
CPC ........ *B29C 64/295* (2017.08); *B29C 64/393* (2017.08); *B33Y 10/00* (2014.12); *B33Y 30/00* (2014.12); *B33Y 50/02* (2014.12); *B81C 1/00373* (2013.01); *B81C 2201/0185* (2013.01)

(56) References Cited

FOREIGN PATENT DOCUMENTS

| | | |
|---|---|---|
| CN | 105196550 A | 12/2015 |
| CN | 105300006 A | 7/2016 |
| CN | 105772722 A | 7/2016 |
| CN | 106142843 A | 11/2016 |
| CN | 106191933 A | 12/2016 |
| CN | 106222085 A | 12/2016 |
| CN | 107053653 A | 8/2017 |
| WO | WO-2017/008891 A1 | 1/2017 |
| WO | WO-2017/035228 A1 | 3/2017 |

OTHER PUBLICATIONS

International Search Report based on International Application PCT/CN2018/075329; dated Apr. 17, 2018; with English Language Abstract.
First Notification of Office Action based on Application No. 201710198238.3; dated Sep. 5, 2018.

* cited by examiner

Fig. 1(Fig.1 as an illustration in Abstract)

SET-UP AND METHOD OF ELECTROHYDRODYNAMIC JET 3D PRINTING BASED ON RESULTANT EFFECT OF ELECTRIC FIELD AND THERMAL FIELD

TECHNICAL FIELD

The present invention belongs to the field of advanced manufacturing technology and relates to one set-up and method of electrohydrodynamic jet 3D printing based on resultant effect of electric field and thermal field.

BACKGROUND 3D printing technology is an advanced manufacturing technology which rapid developed in recent years. 3D printing technology has many advantages compared with traditional removed manufacturing technology, such as manufacturing complex shape parts rapidly and precisely, reducing machining process and shortening the processing cycle, which provides a great potential in the aerospace, biomedical, electronic information and other fields.

M/NEMS devices have developed from flat and single structure to 3D, complex and flexible structure. And the manufacturing process is pursuing simple. 3D printing can realize rapid manufacturing of any designed structures and satisfy the demand for complex, 3D and flexible structures of M/NEMS devices. During printing technology, liquid jet printing technology is an important method to realize printing and manufacturing of 3D M/NEMS device. Liquid jet printing technology can generate droplets at needle orifice through squeezing the liquid in the specific cavity. The squeezing pressure is usually produced by the piezoelectric, ultrasonic, thermal bubble and other methods. The diameter of droplet which is printed by pushing printing technique is about twice the diameter of needle. The diameter of the needle is currently 20-50 µm. The minimum resolution of this pushing printing technology is greater than 20 µm due to the limit of needle size. The materials used in M/NEMS devices includes metals, polymers, ceramics, etc. In addition, these inks need to be solidified at a certain temperature to obtain specific performance. Furthermore, the 3D structure is manufactured by the ink solidified and accumulated layer by layer in a certain temperature in the printing process of 3D M/NEMS devices. However, the printing resolution of droplet jet printing technology which based on piezoelectric, ultrasonic and thermal bubble strongly depends on the needle size. Moreover, the ink is solidified easily on needle orifice in the printing mode with heating, resulting in needle clogging during printing process of micro/nano scale 3D structure. It is difficult for liquid jet printing technology based on piezoelectric, ultrasonic and hot bubbles to realize the printing and manufacturing of 3D structures with micro/nano scale. Thus, its application 3D M/NEMS devices is limited.

SUMMARY

The technical problem to be solved in the present invention is to overcome the shortcomings of the technology mentioned above. This present invention provides a set-up and method for electrohydrodynamic jet 3D printing based on resultant effect of electric field and thermal field. The ink is dragged to form stable micro/nano scale jet which is far smaller than needle size using electric field force applied to needle orifice. The charges of ink migrate and accumulate on the cone surface due to the high potential existing between needle orifice and grounded substrate. The stable micro/nano scale jet which is far smaller than the needle size is formed due to synergetic forces of the electric field, mechanical and surface tension of liquid at needle orifice. At the same time, a thermal field applied between needle and substrate is used to solidify ink which is printed on the substrate. The micro/nano scale 3D structure is manufactured in the manner of printing-solidifying-forming layer by layer. The set-up and method with advantages of wide adaptability of material, high resolution, rapid solidifying rate of ink and manufacturing complex micro/nano scale 3D structures, can be widely used in manufacturing of 3D M/NEMS devices.

The technical solution of the present invention is as follows:

A set-up of electrohydrodynamic jet 3D printing is based on resultant effect of electric field and thermal field. First of all, the ink reaches needle orifice at a constant speed under the resultant effect of fluid field and gravity field. Then a high voltage electric field is applied between needle and substrate. And the ink is dragged to form stable micro/nano scale jet which is far smaller than the needle size using the electric field shear force generated at needle orifice. The solvent evaporation rate of ink increases combined with the radiation of thermal field. Finally, the micro/nano scale 3D structure is fabricated on substrate with the accumulation of jet layer by layer.

A set-up of electrohydrodynamic jet 3D printing based on resultant effect of electric field and thermal field, including an electrohydrodynamic jet module, an XYZ movement module, a thermal field module and a control module.

The electrohydrodynamic jet module includes precision injection pump 1, syringe 2, ink 3, connecting pipe 4, needle clamp 5, needle 6 and high voltage power supply 13; the syringe 2 is placed above precision injection pump 1 and the syringe 2 contains the ink 3; the syringe 2 connects with the needle 6 by a connecting pipe 4; the needle 6 is installed on the needle clamp 5; the needle clamp 5 is fixed on the Z motion axis; one part of needle clamp 5 which is connected with needle 6 is conductive, while the other part connected with Z axis is insulating. The output of the high voltage power supply 13 is connected with the conductive part of needle clamp 5.

The XYZ movement module includes optical platform 9, printing platform 10 and substrate 11; the XYZ motion axis placed above the optical platform 9 is connected with 220 V alternating current to realize moving in three directions; the Y motion axis is bolted to optical platform 9 and the X motion axis is fixed above Y motion axis; the needle clamp 5 is installed on Z motion axis; the movement of Z motion axis is used to adjust print height of needle; the printing platform 10 made of ceramic or metal is connected to ground; the substrate 11 is placed above the printing platform 10 and moves accordingly; the 3D structure 12 is printed on the substrate 11 combined with the movements of printing platform 10 in the direction of XY axis and needle 6 in the direction of Z axis.

The thermal field module includes 3D structure 12, power 14, temperature controller 15, heating rods 16, heating lamps 17 and the heating wires 18; the power 14 is used to provide voltage for heating rods 16, heating lamps 17 and the heating wires 18; the heating rods 16 are embedded in the printing platform 10; the heating lamps 17 are placed between substrate 11 and needle 6; the heating wires 18 surround the outside surface of needle 6; different heat sources can produce three kinds of then anal field at different positions; in order to adjust the temperature of then thermal field, the temperature controller 15 is used to detect temperature of thermal field and adjusts output current of the power 14 to change actual powers of heating rods 16, heating lamps 17 and heating wires 18; the ink 3 can be printed with fine jet with effect of the electrohydrodynamic jet module; the solvent evaporation rate of low boiling point solvent in the jet increases quickly with effect of thermal field; semi-solidified or solidified high resolution droplets arrive at substrate 11 continuously; the micro/nano 3D structure 12 is produced by deposition layer by layer.

The control module includes the computer 7 and the motion controller 8; the computer 7 feedbacks the 3D printing process using a monitoring software and real-time adjusts the printing parameters; the motion controller 8 receives the control command issued by the computer 7 through the USB data cable, at the same time, outputs the motion parameters to the XYZ motion axis.

A method of electrohydrodynamic jet 3D printing based on resultant effect of electric field and thermal field includes the following steps:

1) Stable Electrohydrodynamic Jet Droplet

The ink 3 is sucked into the syringe 2; the ink 3 is fed to needle 6 with the pushing of precision injection pump 1 using connecting pipe 4; the precision injection pump 1 is used to adjust the flow rate of ink 3 during the process of printing; the vertical distance between needle 6 and substrate 11 is adjusted through movement of Z axis; the high voltage power supply 13 applies high voltage between needle 6 and printing platform 10 and electric field force is generated; the stable micro/nano scale droplet which is far smaller than the needle size is formed due to synergetic forces of the electric field, mechanical and surface tension of liquid at needle orifice.

2) Thermally-Assisted Manufacturing 3D Structure

Thermal field is generated stably in collaboration of power 14, temperature controller 15 and heat source (including heating rod 16, heating lamps 17 and the heating wires 18); temperature controller 15 adjusts the temperature of thermal field; the ink 3 is exposed to thermal field radiation in different positions, including in the needle 6, during jetting and arriving on the substrate 11; the controlling program of XYZ axis motion is designed on the computer 7 based on micro 3D structure 12; the motion states of printing platform 10 and needle 6 are controlled by the motion controller 8 and the flow rate of ink 3 is set at the same time; the solvent of high resolution jet is evaporated rapidly with resultant effect of electric field and thermal field; meanwhile, the state of tiny droplets become semi-solidified or solidified gradually because of rapid solvent evaporation; then, the semi-solidified or solidified droplets arrive to substrate 11 and accumulate layer by layer; the micro/nano scale 3D structure 12 is printed under the cooperation of XYZ movement; the forming of micro/nano scale 3D structure 12 is resultant influenced by the electric field between printing platform 10 and needle 6, thermal field, XYZ axis movement and flow rate of ink 3.

The present invention has the following beneficial effects: 3D structure is manufactured by the method of electrohydrodynamic jet 3D printing based on resultant effect of electric field and thermal field. This printing technology is a novel method to manufacture 3D structure. The stable micro/nano scale jet which is far smaller than the needle size is formed by pulling the ink using the electric field force. At the same time, the tiny droplet solidifies rapidly under the effect of thermal field. This method describing in present invention owns many advantages, including wide adaptability of material and manufacturing complex micro/nano scale 3D structures.

Figure 1:
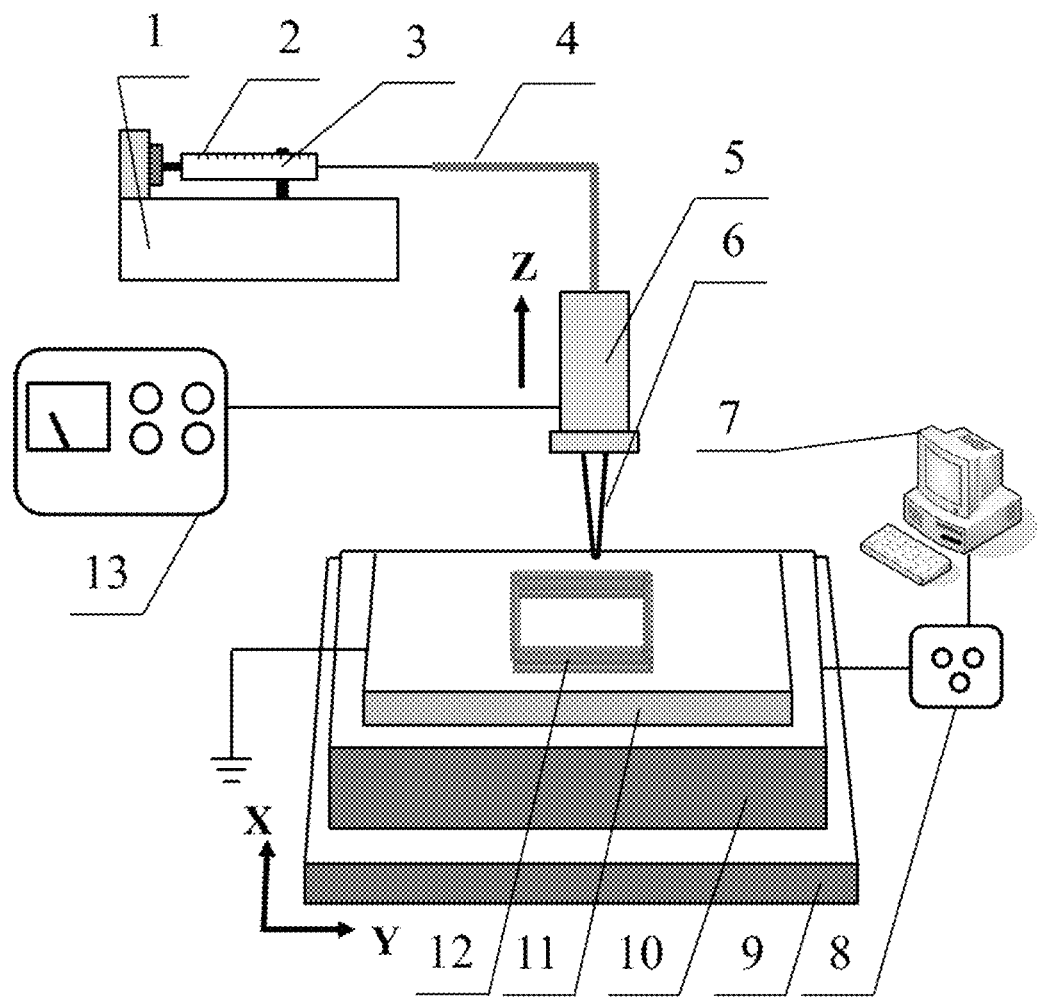
FIG. 1 is schematic diagram of set-up of electrohydrodynamic jet 3D printing based on resultant effect of electric field and thermal field.
Figure 2:
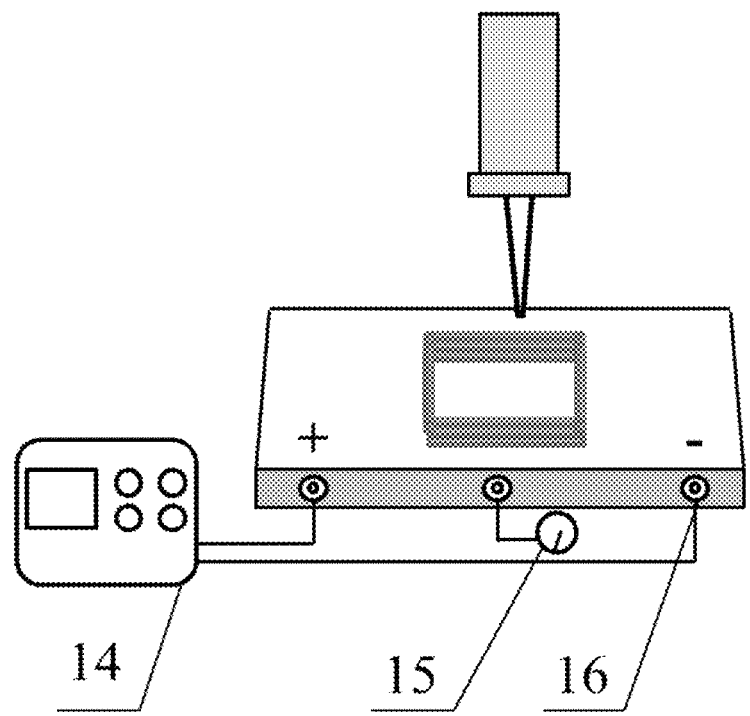
FIG. 2 is schematic diagram of heating rods embedding into printing platform.
Figure 3:
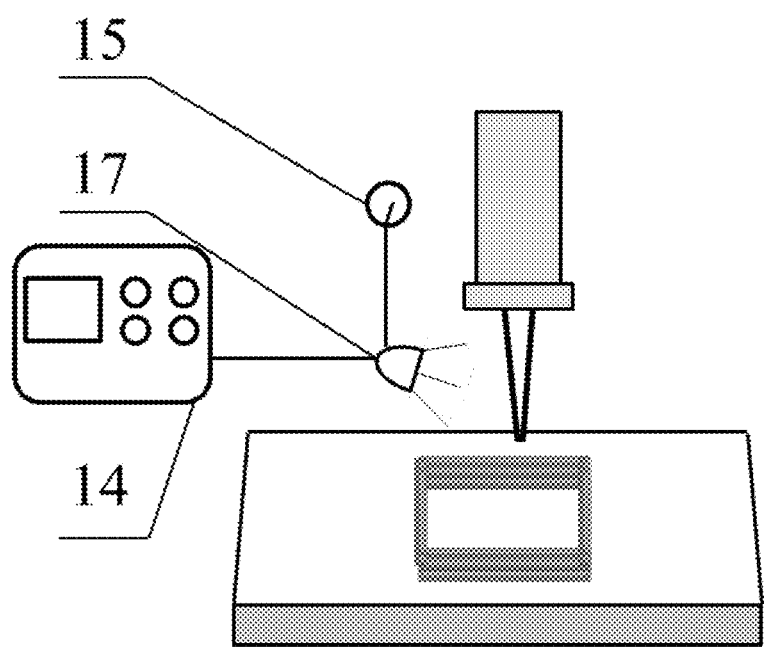
FIG. 3 is schematic diagram of heating lamps irradiation.
Figure 4:
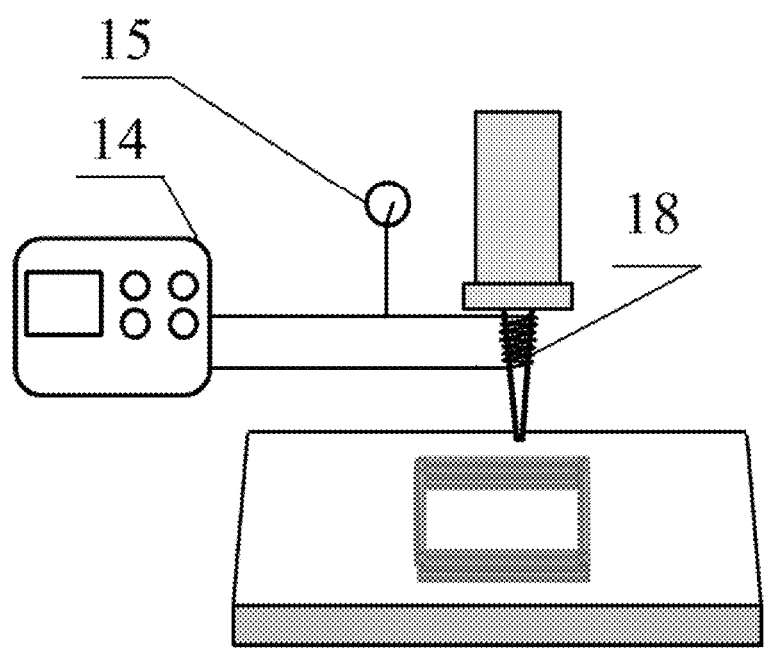
FIG. 4 is schematic diagram of heating wires surrounding outside of the needle.

precision injection pump 1; syringe 2; ink 3; connecting pipe 4; needle clamp 5; needle 6; computer 7; motion controller 8; optical platform 9; printing platform 10; substrate 11; 3D structure 12; high voltage power supply 13; power 14; temperature controller 15; heating rods 16; heating lamps 17; the heating wires 18.

DETAILED DESCRIPTION

Specific embodiment of the present invention is described below in detail in combination with the technical solution and accompanying drawings.

The set-up of electrohydrodynamic jet 3D printing based on resultant effect of electric field and thermal field in detailed description mainly comprise four parts: an electrohydrodynamic jet module, an XYZ movement module, a thermal field module and a control module.

The syringe 2 is placed above precision injection pump 1 and the syringe 2 contains ink 3; the ink 3 is polyethylene glycol solvent; the solvent of ink 3 is the mixture of ethanol and deionized water and the mass fraction of polyethylene glycol is 40%; two ends of connecting pipe 4 are connected with syringe 2 and needle 6, respectively; the needle 6 is installed on needle clamp 5; the inner diameter of needle orifice is 80±5 μm; the needle clamp 5 is fixed on the Z axis; one part of needle clamp 5 which is connected with needle 6 is conductive, while the other part connected with Z axis is insulating; the output of the high voltage power supply 13 is connected with the conductive part of needle clamp 5; the input voltage of high voltage power supply 13 is connected with 220 V alternating current and the output voltage of high voltage power supply 13 is 1000 V.

The three motion axes are placed above the optical platform 9 is connected with 220 V alternating current to realize moving in three directions; the Y motion axis is bolted to optical platform 9 and the X motion axis is fixed above Y motion axis; the needle clamp 5 is installed on the Z motion axis; the movement of Z motion axis is used to adjust print height which is the vertical distance between needle 6 and print platform 10; the printing height is 200 μm in this detailed description; the printing platform 10 made of ceramic or metal is connected to the ground; the printing platform 10 is fixed on Y motion axis by insulating material screw and washer; the substrate 11 is placed on the printing platform 10 and moves accordingly; the 3D structure 12 is printed on the substrate 11 combined with the movements of printing platform 10 in the direction of XY axis and the movement of needle 6 in the direction of Z axis.

The power 14 connected with 220 V alternating current is used to provide voltage for temperature controller 15, heating rods 16, heating lamps 17 and heating wires 18; the heating rods 16 are embedded in the printing platform 10;

the heating lamps 17 are placed between substrate 11 and needle 6; heating wires 18 surround the outside surface of needle 6; different heat sources can produce three kinds of thermal field at different positions; the maximum output power of the heat source is 400 W; temperature controller 15 monitoring range of 25–500° C. is used to detect the temperature of thermal field and adjusts outputting current of power 14; in order to adjust the temperature of thermal field, the temperature controller 15 is used to detect temperature of thermal field and adjusts output current of the power 14 to change actual powers of heating rods 16, heating lamps 17 and heating wires 18; the ink 3 can be printed with fine jet with effect of the electrohydrodynamic jet module; the solvent evaporation rate of low boiling point solvent in the jet increases quickly with effect of thermal field; semi-solidified or solidified high resolution droplets arrive at substrate 11 continuously; the micro/nano 3D structure 12 is produced by deposition layer by layer.

The motion controller 8 receives the control command issued by the computer 7 through the USB data cable, at the same time, outputs the motion parameters to the XYZ motion axis through the 232 interface; in other words, moving direction and speed of printing platform 10 are controlled by motion controller 8.

The concrete implementation includes the following steps:

1) Stable Electrohydrodynamic Jet Droplet

The ink 3 (polyethylene glycol solvent) is sucked into syringe 2 (range of 250 μL); the ink 3 is fed to needle 6 with pushing of precision injection pump 1 using connecting pipe 4; the precision injection pump 1 is used to adjust flow rate of ink 3 during printing; the inside diameter of needle orifice of needle 6 is 200±5 μm; the vertical distance between needle 6 and substrate 11 is adjusted through movement of Z axis; the range of printing height (vertical distance) is 200-500 μm; the high voltage power supply 13 applies high voltage (2000-4000 V) between needle 6 and printing platform 10 and electric field force is generated; the stable micro/nano scale droplet which is far smaller than the needle size is formed due to synergetic forces of the electric field, mechanical and surface tension of liquid at needle orifice; the diameter range of droplet is 80 nm-50 μm.

2) Thermally-Assisted Manufacturing 3D Structure

Thermal field is generated stably in collaboration of power 14, temperature controller 15 and heat source (including heating rod 16, heating lamps 17 and the heating wires (18); temperature controller 15 adjusts the temperature of thermal field which is kept at 100° C. during printing; the ink 3 is exposed to thermal field radiation in different positions, including in the needle 6, during jetting and arriving on the substrate 11; the controlling program of XYZ axis motion is designed on the computer 7 based on micro 3D structure 12; firstly, control command is transmitted to the motion controller 8; then motion controller 8 sends control command to XYZ axis to control printing motion directions and speeds of printing platform 10 and needle 6; the speed of XY motion axes is 5 minis; the speed of Z motion axis is 1 minis; the flow rate of ink 3 is set at 0.5 μL/min. the solvent of high resolution jet is evaporated rapidly with resultant effect of electric field and thermal field; meanwhile, the state of tiny droplets become semi-solidified or solidified gradually because of rapid solvent evaporation; then, the semi-solidified or solidified droplets arrive to substrate 11 and accumulate layer by layer; the micro/nano scale 3D structure 12 is printed under the cooperation of XYZ movement; the forming of micro nano scale 3D structure 12 is resultant influenced by the electric field between printing platform 10 and needle 6, thermal field, XYZ axis movement and flow rate of ink 3.

The present invention has the following beneficial effects: 3D structure is manufactured by the method of electrohydrodynamic jet 3D printing based on resultant effect of electric field and thermal field. This printing technology is a novel method to manufacture 3D structure. The stable micro/nano scale jet which is far smaller than the needle size is formed by pulling the ink using the electric field force. At the same time, the tiny droplet solidifies rapidly under the effect of thermal field. This method describing in present invention owns many advantages, including wide adaptability of material and manufacturing complex micro/nano scale 3D structures.

The invention claimed is:

1. A set-up of electrohydrodynamic jet 3D printing based on resultant action of electric field and thermal field, wherein the set-up for electrohydrodynamic jet 3D printing includes an electrohydrodynamic jet module, an XYZ movement module, a thermal field module and a control module; the electrohydrodynamic jet module includes a precision injection pump, a syringe, ink, a connecting pipe, a needle clamp, a needle and a high voltage power supply; the syringe is placed above the precision injection pump and the syringe contains the ink; the syringe connects with the needle by the connecting pipe; the needle is installed on the needle clamp; the needle clamp is fixed on the Z motion axis; one part of the needle clamp which is connected with the needle is conductive, while the other part connected with a Z axis is insulating; the output of the high voltage power supply is connected with the conductive part of the needle clamp; the XYZ movement module includes an optical platform, a printing platform and a substrate; an XYZ motion axis placed above the optical platform is connected with a 220 V alternating current to realize movement in three directions; the Y motion axis is bolted to the optical platform and the X motion axis is fixed above the Y motion axis; the needle clamp is installed on the Z motion axis; the movement of the Z motion axis is used to adjust a print height of needle; the printing platform made of ceramic or metal is connected to a ground; the substrate is placed above the printing platform and moves accordingly; a 3D structure is printed on the substrate combined with the movements of the printing platform in the direction of the XY axis and the needle in the direction of Z axis; the thermal field module includes the 3D structure, a power, a temperature controller, heating rods, heating lamps and heating wires; the power is used to provide voltage for the heating rods, the heating lamps and the heating wires; the heating rods are embedded in the printing platform; the heating lamps are placed between the substrate and the needle; the heating wires surround the outside surface of the needle; the different heat sources can produce three kinds of a thermal field at different positions; in order to adjust the temperature of the thermal field, the temperature controller is used to detect the temperature of the thermal field and adjusts an output current of the power to change actual powers of the heating rods, heating lamps and heating wires; the ink can be printed in a fine jet with effect of the electrohydrodynamic jet module; the solvent evaporation rate of a low boiling point solvent in the jet increases quickly with effect of the thermal field; semi-solidified or solidified high resolution droplets arrive at the substrate continuously; the 3D structure with micro or nano dimensions is produced by deposition layer by layer; the control module includes a computer and a motion controller; the computer is a feedback for the 3D printing process using a monitoring software and real-time adjusts the printing parameters; the motion controller receives the control command issued by the computer through a USB data cable and, at the same time, outputs the motion parameters to the XYZ motion axis.

2. A method of electrohydrodynamic jet 3D printing based on resultant effect of an electric field and a thermal field includes the following steps:
1) producing a stable electrohydrodynamic jet droplet whereby an ink is sucked into a syringe; the ink is fed to a needle with the pushing of a precision injection pump using a connecting pipe; the precision injection pump is used to adjust a flow rate of the ink during the process of printing; vertical distance between the needle and the substrate is adjusted through movement in a Z axis; a high voltage power supply applies high voltage between the needle and a printing platform and an electric field force is generated; a stable micro/nano scale droplet which is far smaller than the needle orifice size is formed due to synergetic forces of the electric field and surface tension of the droplet at the needle orifice;
2) thermally-assisted manufacturing a 3D structure whereby a thermal field is generated stably in collaboration of a power, a temperature controller and a heat source including a heating rod, heating lamps and heating wires; the temperature controller adjusts the temperature of the thermal field; the ink is exposed to the thermal field radiation in different positions, including in the needle, during jetting and upon arriving on the substrate; the controlling program of an XYZ axis motion is designed on a computer based on a micro/nano scale 3D structure; motion states of a printing platform and the needle are controlled by a motion controller and the flow rate of the ink is set at the same time; a solvent of a high resolution jet is evaporated rapidly with the resultant effect of the electric field and the thermal field; meanwhile, tiny droplets become semi-solidified or solidified gradually because of the rapid solvent evaporation; then, the semi-solidified or solidified droplets arrive to the substrate and accumulate layer by layer; the micro/nano scale 3D structure is printed under the cooperation of the XYZ movement; the forming of the micro/nano scale 3D structure is influenced by the electric field between the printing platform and the needle, the thermal field, the XYZ axis movement and the flow rate of the ink.

* * * * *